United States Patent [19]

Fukuda et al.

[11] 4,447,790
[45] May 8, 1984

[54] DISTORTION ELIMINATING CIRCUIT

[75] Inventors: Ryuichi Fukuda; Masami Fujiwara; Norio Ishiguro, all of Kawasaki, Japan

[73] Assignee: Nippon Columbia Kabushikikaisha, Tokyo, Japan

[21] Appl. No.: 309,578

[22] Filed: Oct. 8, 1981

[30] Foreign Application Priority Data

Oct. 13, 1980 [JP] Japan ............................ 55-145579[U]
Oct. 13, 1980 [JP] Japan ............................ 55-145580[U]

[51] Int. Cl.³ ............................ H03F 1/26; H03F 3/26
[52] U.S. Cl. ............................ 330/149; 330/151; 330/267
[58] Field of Search ............... 330/149, 151, 262, 267, 330/273

[56] References Cited

PUBLICATIONS

Bennett et al., "Feedforward-an Alternative Approach to Amplifier Linearization", *Radio & Electronic Engineering*, vol. 44, No. 5, May 1974.

Primary Examiner—James B. Mullins
Assistant Examiner—G. Wan
Attorney, Agent, or Firm—Murray Schaffer

[57] ABSTRACT

A distortion eliminating circuit includes an amplifier and a difference detector for detecting a difference between two signals. In this case, the input signal to the amplifier and the output signal therefrom, at least one of which is adjusted in level are applied to the difference detector, or the amplifier is made of a push-pull amplifier consisting of transistors opposite in conductivity type and a series connection of resistors is connected in parallel to a series connection of the emitter resistors of the push-pull amplifier to apply the output obtained at the connection point of the series connection of the resistors to the difference detector which is supplied with the input signal to the push-pull amplifier, and the output from the difference detector is added to the output from the amplifier, to thereby eliminate the distortion of the amplifier.

7 Claims, 7 Drawing Figures

DISTORTION ELIMINATING CIRCUIT

BACKGROUND OF THE INVENTION

1. Field of the Invention

The present invention relates generally to a distortion eliminating circuit, and is directed more particularly to a distortion eliminating circuit of the feed forward type for use with an amplifier.

2. Description of the Prior Art

In general, since an amplifier which forms an amplifying circuit used in an audio circuit is nonlinear, in order to eliminate distorted components from its output signal the amplifier is provided with a negative feedback loop. When a number of such negative feedback amplifiers are connected to increase the amount of the feedback, defects are created wherein the circuit is oscillated by the frequency characteristics, the time delay of negatively fed back signal and so on that great distortion is transiently generated.

In order to eliminate the distortion components without using the negative feedback technique, a distortion eliminating circuit has been suggested by the prior art which is of the feed forward type.

A prior art amplifier having a distortion eliminating circuit of the feed forward type will be explained with reference to FIG. 1. In the circuit of FIG. 1, an input signal $S_1$ applied to an input terminal 1 is fed to an amplifier 10 formed of a power amplifier and thereby amplified. An output signal $S_2$ therefrom is supplied through a resistor 4 to a load resistor 7. In FIG. 1, 30 designates a differential amplifier which is supplied with the input signal $S_1$ and the output signal $S_2$ which is same in phase as the input signal $S_1$. Thus, the amplifier 30 differentially amplifies both signals $S_1$ and $S_2$, detects a difference therebetween and delivers a difference signal $S_4$ between the signals $S_1$ and $S_2$. In this case, since the amplifying characteristic of the amplifier 10 is non-linear, the output signal $S_2$ therefrom contains distorted components $S_D$. Therefore, if the levels of the signals $S_1$ and $S_2$ are selected suitably, the difference signal $S_4$ delivered from the differential amplifier 30 becomes the same as the distortion components $S_D$ from the amplifier 10.

The differential output $S_4$ is fed through the resistor 6 to an adding point 5 and added to the output signal $S_2$ supplied to the point 5, and then supplied to the load 7 as an output signal $S_3$. In this case, since the distortion component derived from the differential amplifier 30 is opposite in phase to the distortion component $S_D$ contained in the output signal $S_2$, when both signals $S_2$ and $S_4$ are added to each other at the point 5, the distortion components thereof are cancelled with each other. Therefore, the output signal $S_3$ appeared at the point 5 and fed to the load 7 contains no distortion components. Thus, in the circuit of FIG. 1, the resistors 4 and 6 each serve as an adding resistor.

The reason why the signal $S_3$ contains no distortion component or is an output with no distortion component will become more apparent from the following description. Now, it be assumed that the voltages of signals $S_1$, $S_2$, $S_3$ and $S_4$ are respectively taken as $e_1$, $e_2$, $e_3$ and $e_4$; the resistance values of resistors 4, 6 and 7 as $R_1$, $R_2$ and $R_L$; the currents flowing through resistors 4, 6 and 7 as $i_1$, $i_2$ and $i_3$; the amplification degree of the amplifier 10 as $A_1$; and that of the differential amplifier 30 as $A_2$ as shown in FIG. 1. Then, the following equations (1) to (5) are respectively established.

$$e_2 = A_1 \cdot e_1 \qquad (1)$$

$$e_4 = (e_1 - e_2)A_2 \qquad (2)$$
$$= (1 - A_1)A_2 \cdot e_1$$

$$i_1 = \frac{e_2 - e_3}{R_1} \qquad (3)$$

$$i_2 = \frac{e_4 - e_3}{R_2} \qquad (4)$$

Accordingly, the output voltage $e_3$ is expressed as follows:

$$e_3 = (i_1 + i_2)R_L \qquad (5)$$

$$= \left(\frac{R_2 - R_1 \cdot A_2}{R_1 \cdot R_2}\right) R_L \cdot A_1 \cdot e_1 +$$

$$\frac{A_2}{R_2} R_L \cdot e_1 - \left(\frac{1}{R_1} + \frac{1}{R_2}\right) R_L \cdot e_3$$

As described above, the amplification degree $A_1$ is non-linear as well known. In this case, if it be assumed that the amplification characteristic of the differential amplifier 30 is linear since it processes the signal of a low level and that the first factor including $A_1$ of the right side of the equation (5) is zero, the output voltage $e_3$ contains no distortion component. Accordingly, in order to cancel the distortion components with each other, it is sufficient that the following equation (6) is established.

$$A_2 = \frac{R_2}{R_1} \qquad (6)$$

In other words, if the amplification degree $A_2$ is selected to satisfy the equation (6), the output with no distortion can be obtained at the point 5 irrespective of the amplification degree $A_1$ of the amplifier 10.

The inventors of this invention already proposed amplifying circuits as shown in FIGS. 2 and 3 each of which can eliminate the distortion of the amplifying circuit having an output stage of the emitter follower type by a distortion eliminating circuit of the feed forward type such as shown in FIG. 1. In FIGS. 2 and 3, the references same as those FIG. 1 designate the same elements.

In the circuit of FIG. 2, an emitter follower type amplifier transistor 2 is used as the amplifier 10. The signal $S_2$ obtained at the emitter of the transistor 2 is fed through the emitter resistor 4 and point 5 to the load resistor 7 as the output signal $S_3$. In this case, the amplifying characteristic of the transistor 2 is non-linear, so that the output signal $S_2$ from the transistor 2 is distorted.

In order to detect the distortion component, the differential amplifier 30 is used which is supplied at its non-inverted input terminal with the input signal $S_1$ and at its inverted input terminal with the output signal $S_2$. The output signal $S_4$ from the differential amplifier 30 is added through the adding resistor 6 to the output signal $S_2$ at the point 5.

With the circuit of FIG. 2, the differential amplifier 30 operates as the difference detecting circuit between the signals $S_1$ and $S_2$ and produces the signal $S_4$, which corresponds to the opposite-phased distortion component contained in the signal $S_2$ from the amplifier 10, so that the distortion components are cancelled with each other at the point 5. In this case, the amplification degree $A_2$ of the differential amplifier 30 is of course selected also to satisfy the equation (6).

As set forth above, by selecting the amplification degree $A_2$ of the differential amplifier 30 as $(R_2/R_1)$, the output signal $S_3$ with no distortion can be obtained at the point 5 regardless of the amplification degree $A_1$ of the amplifier 10. Accordingly, since the distortion can be positively eliminated without using negative feedback structure, there is no defect inherent to the negative feedback structure.

In the circuit of FIG. 3, the amplifier 10 shown in FIG. 1 is formed of a push-pull amplifier which consists of mainly NPN-type and PNP-type transistors 2 and 14 and 12 and 15 designate coupling capacitors. Emitter resistors 13 and 16 are respectively connected in series to the transistors 2 and 14. The connection point between the emitter resistors 13 and 16 is connected through the adding resistor 4 and point 5 to the load resistor 7. The signal $S_2$ obtained at the connection point between the emitter resistors 13 and 16 and the input signal $S_1$ are both supplied to the differential amplifier 30 and then differentially amplified, by which the distortion component is detected.

By the circuit of FIG. 3, the distortion component generated from the push-pull amplifier 10 is cancelled by the distortion component delivered from the differential amplifier 30 similar to the circuit of FIG. 2.

In the prior art amplifying circuits of FIGS. 2 and 3, the input signal level to the differential amplifier 30 becomes $(1-A_1)e_1$, so that the voltage $e_4$ of the differential output signal $S_4$ is expressed as follows:

$$e_4 = (1-A_1)A_2 \cdot e_1 \qquad (7)$$

Where, since $A_1$ is nearly 1 ($A_1 \div 1$), the voltage $e_4$ is very low in level. Therefore there may be such a fear that the differential amplifier 30 is driven by the output signal $S_3$ having a high amplitude and appeared at the point 5 from the amplifier 10 and hence the output from the differential amplifier 30 is distorted. To avoid this defect, it is necessary to increase the power capacity of the differential amplifier 30. Further, in this case the power consumption of the drive current flowing through the resistor 4 can not be neglected, but this defect can not be avoided.

The current $i_2$ flowing through the resistor 6 at this time can be expressed from the equations (4), (5) (6) and (7) as follows:

$$i_2 = (1 - A_1)\frac{1}{R_1} e_1 - \frac{R_1//R_L//R_2}{R_1 \cdot R_2} e_1 \qquad (8)$$

In the above amplifying circuits of FIGS. 1, 2 and 3, since the outputs from the amplifier 10 and the differential amplifier 30 are composed or added, a pair of the adding resistors 4 and 6 are required. Although the adding resistor 4 is small in resistance value, it consumes rather large power since this resistor 4 is inserted into the path to supply the output current to the load.

OBJECTS AND SUMMARY OF THE INVENTION

Accordingly, an object of the present invention is to provide a novel distortion eliminating circuit for use with an amplifier of the feed forward type.

Another object of the invention is to provide a distortion eliminating circuit for an amplifier of the feed forward type in which a distortion component detecting circuit is made small in size.

A further object of the invention is to provide a distortion eliminating circuit for use with an amplifier of the feed forward type in which useless power consumption can be reduced.

According to an aspect of the present invention there is provided a distortion eliminating circuit for use with an amplifier, which comprises:

(a) an amplifier for amplifying an input signal;

(b) difference detecting means for detecting difference between two signals;

(c) first transmitting means for transmitting the input signal to said difference detecting means;

(d) second transmitting means for transmitting an output signal from said amplifier to said difference detecting means;

(e) adding means for adding the outputs from said amplifier and difference detecting means to each other and supplying an added signal to a load; and (f) adjusting means for adjusting at least one of said first and second transmitting means.

The other objects, features and advantages of the present invention will become apparent from the following description taken in conjunction with the accompanying drawings through which the like references designate the same elements and parts.

DESCRIPTION OF THE PREFERRED EMBODIMENTS

An example of the distortion eliminating circuit for use with an amplifier according to the present invention will be described with reference to FIG. 4 in which the references same as those used in FIGS. 1 to 3 designate the same elements and parts.

Figure 4:
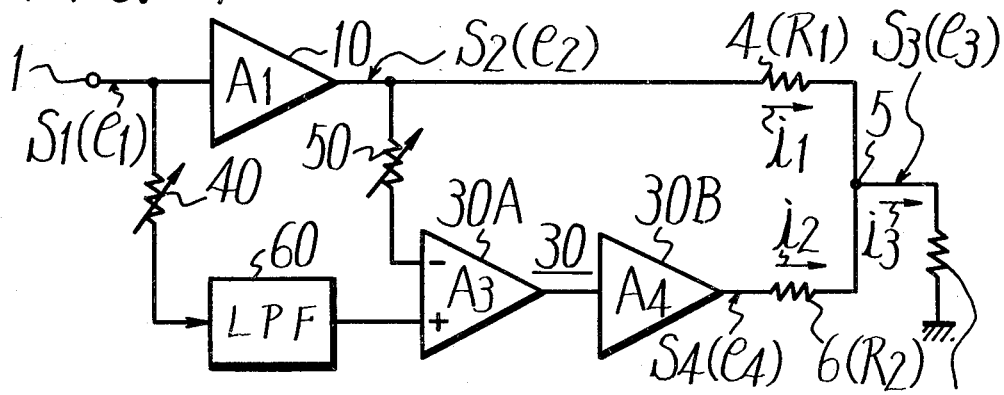
FIG. 4 is a connection diagram showing an example of the distortion eliminating circuit for use with an amplifier according to the present invention.

In the example of the invention shown in FIG. 4, the differential amplifier 30, which serves to detect the difference between two signals, is composed of a pair of differential amplifiers 30A and 30B which are connected in cascade. The first stage differential amplifier 30A is supplied at its non-inverted input terminal with the input signal $S_1$ through a first level adjusting circuit or device 40 and also at its inverted input terminal with the output signal $S_2$ from the amplifier 10 through a second level adjusting circuit or device 50.

Figure 1:
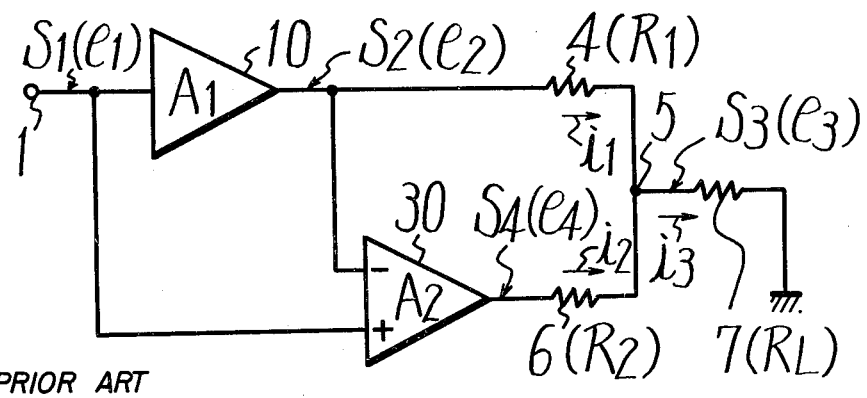
FIG. 1 is a connection diagram showing a prior art distortion eliminating circuit employing the feed forward system for use with an amplifier.
Figure 2:
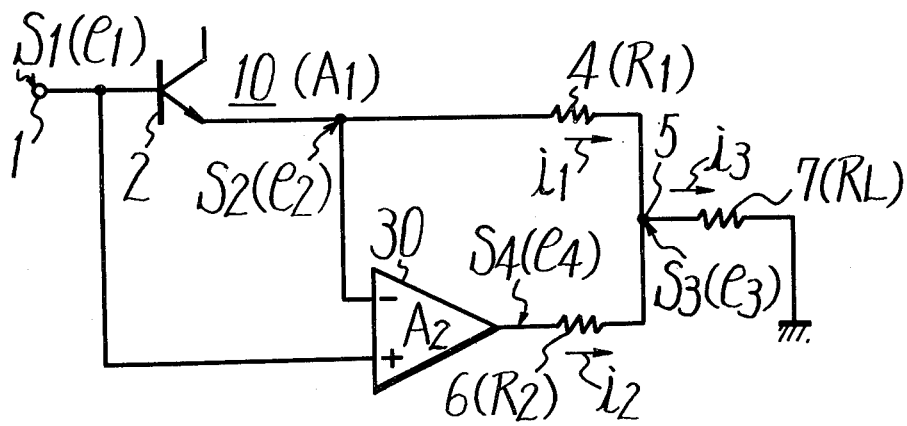
FIGS. 2 and 3 are connection diagrams each showing another prior art distortion eliminating circuit.

The output i.e. differential output $S_4$ from the differential amplifier 30 is supplied through the adding resistor 6 and the point 5 to the load resistor 7 similar to the prior art circuit of FIG. 1.

As shown in FIG. 4, a low pass filter 60 is provided between the first level adjusting device 40 and the first stage differential amplifier 30A. This low pass filter 60 functions to compensate for the frequency characteristic when it becomes a high frequency intensification type caused when the common mode rejection ratio of the differential amplifiers 30A and 30B at high frequency band becomes low and to present flat frequency characteristic similar to the output signal $S_2$. Thus, the low pass filter 60 could be omitted.

In the circuit of the invention shown in FIG. 4, if it is assumed that the attenuation ratios of the first and second level adjusting devices 40 and 50 are taken as $1/k_1$ and $1/k_2$ and the amplification degrees of the differential amplifiers 30A and 30B as $A_3$ and $A_4$, respectively, the voltage $e_3$ of the output signal $S_3$ at the point 5 becomes as follows:

$$e_3 = \frac{R_2 - \frac{A_3}{k_2} A_4 \cdot R_1}{R_1 \cdot R_2} R_L \cdot A_1 \cdot e_1 + \quad (9)$$

$$\frac{\frac{A_3}{k_1} A_4}{R_2} R_L \cdot e_1 - \left( \frac{1}{R_1} + \frac{1}{R_2} \right) R_L \cdot e_3$$

Therefore, the condition for presenting no distortion becomes as follows:

$$R_2 - \frac{A_3}{k_2} A_4 \cdot R_1 = 0 \therefore A_4 = \frac{R_2}{R_1} \cdot \frac{k_2}{A_3} \quad (10)$$

At this time, the voltage $e_3$ becomes as follows:

$$e_3 = \frac{R_1//R_L//R_2}{R_1} \cdot \frac{k_2}{k_1} e_1 \quad (11)$$

The voltage $e_4$ of the output signal $S_4$ from the differential amplifier 30 becomes as follows:

$$e_4 = \left( \frac{1}{k_1} - \frac{A_1}{k_2} \right) A_3 \cdot A_4 \cdot e_1 \quad (12)$$

When the condition for presenting no distortion as expressed by the equation (10) is satisfied, the amplification characteristic of the amplifier 10 can be considered linear equivalently. Accordingly, if non-distortion component of the amplification degree $A_1$ of the amplifier 10 is taken as $A_0$, it can be assumed that $A_1 = A_0$. Therefore, a voltage $e_4'$ of the output signal from the differential amplifier 30 at this time can be expressed from the equations (10) and (12) as follows:

$$e_4' = \left( \frac{k_2}{k_1} - A_0 \right) \frac{R_2}{R_1} e_1 \quad (12')$$

Now, if the input signal component (expressed by the equation (12')) contained in the differential output signal $S_4$ from the differential amplifier 30 is made same as the output signal $S_2$ from the amplifier 10 in phase and level, it is avoided that the differential amplifier 30 is driven by the amplifier 10 or its output signal.

In order to prevent an inverse current $i_2$ flowing through the resistor 6 in the opposite direction under the above condition that no distortion is presented, the following equation (13) must be satisfied.

$$e_3 = e_4' \quad (13)$$

Therefore, the following equation (14) is derived.

$$\frac{k_2}{k_1} = \frac{R_2 \cdot A_0}{R_2 - (R_1//R_L//R_2)} \quad (14)$$

The voltage $e_3$ of the output signal $S_3$ at this time is expressed as follows:

$$e_3 = \frac{R_L}{R_1 + R_L} A_0 \cdot e_1 \quad (15)$$

Therefore, if the equation (10) is satisfied, the output signal $S_3$ with no distortion is obtained, and if the equation (14) is satisfied, the differential amplifier 30 is not driven by the output signal $S_3$ of a large amplitude.

Figure 5:
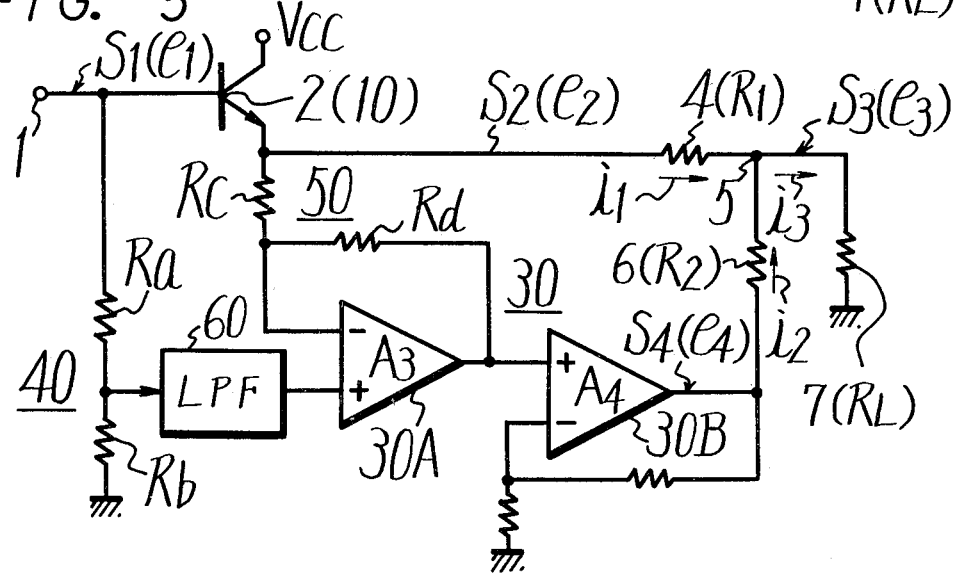
FIGS. 5, 6 and 7 are connection diagrams each showing other example of the invention.

FIG. 5 shows another example of the invention. In this example, a power amplifying transistor 2 is used as the amplifier 10, the first level adjusting device 40 is made of a voltage divider i.e. pair of resistors $R_a$ and $R_b$, the attenuation ratio $1/k_1$ of which is determined by the ratio of the resistance values of the resistors $R_a$ and $R_b$, and the second level adjusting device 50 is made of a pair of resistors $R_c$ and $R_d$ similar to the first level adjusting device 40. The other circuit construction and operation are substantially same as those of FIG. 4.

Figure 6:
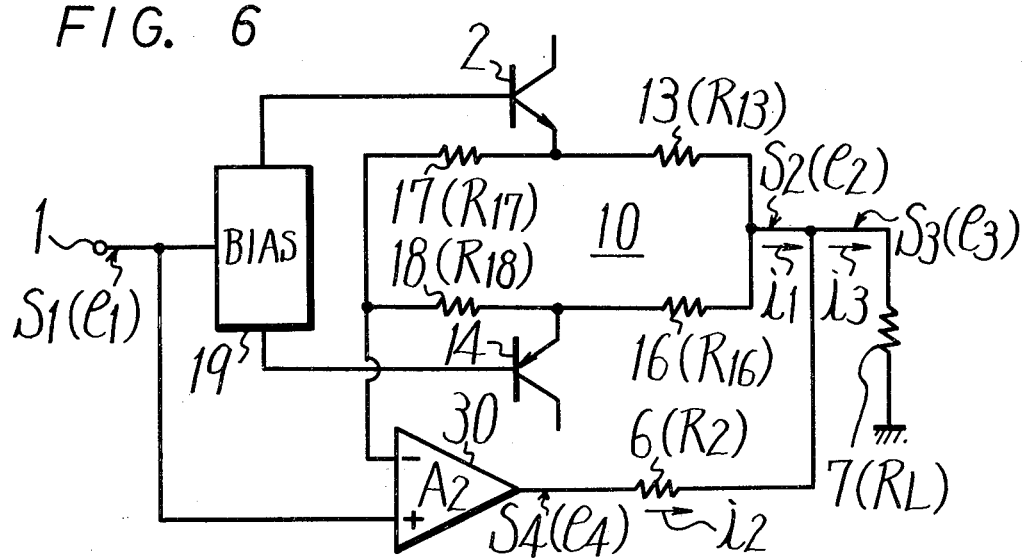

FIG. 6 shows a further example of the invention. In this example, the amplifier 10 is made of a push-pull amplifier consisting of NPN-type and PNP-type transistors 2 and 14. In this case, a series connection of emitter resistors 13 and 16 is inserted between the emitters of transistors 2 and 14, and a series connection of first and second resistors 17 and 18 is connected in parallel to the serially connected emitter resistors 13 and 16. The connection point of the resistors 17 and 18 is connected to the inverted input terminal of the differential amplifier 30 whose non-inverted input terminal is connected to the input terminal 1. A bias circuit 19 is connected between the input terminal 1 and the bases of transistors 2, 14. The connection point between the emitter resistors 13 and 16 is connected to the point 5 directly.

In the circuit of FIG. 6, by selecting the bias to the push-pull amplifier 10, this push-pull amplifier 10 can be operated as A-class or B-class amplifier.

Further, in the circuit of FIG. 6, the emitter resistors 13 and 16 are each selected to have the resistance value smaller than one ohm ($\Omega$), and the first and second resistors 17 and 18 are each selected to have such a resistance value which is smaller than the input impedance of the differential amplifier 30 but as large as possible, for example, several $K\Omega$.

When the push-pull amplifier 10 operates in B-class, the transistors 2 and 14 become ON alternately. For example, when the transistor 2 is ON, the other transistor 14 is OFF. Therefore, it can be substantially considered that the series connection of resistors 17 and 18 is connected in parallel to the emitter resistor 13. Accordingly, this case is substantially same as the case where in the circuit of FIG. 3 the inverted input terminal of the differential amplifier 30 is connected to a mid point of the adding resistor 4 because the resistors 17 and 18 are selected equal in resistance value. Therefore, in order to eliminate any distortion, it is sufficient to select the amplification degree $A_2$ of the differential amplifier 30 as $$\frac{2R_2}{R_{13}} = \frac{2R_2}{R_{16}}$$

where $R_{13}$ and $R_{16}$ are the resistance values of the emitter resistors 13 and 16, respectively. That is, the output signal $S_3$ with no distortion can be obtained regardless of the amplification degree $A_1$ of the push-pull amplifier 10.

When the push-pull amplifier 10 operates in A-class, the transistors 2 and 14 are both always ON. Thus, the composite resistor of the emitter resistors 13 and 16 serves as the adding resistor 4 of the circuit shown in FIG. 3. Thus, if the amplification degree $A_2$ of the differential amplifier 30 is selected as $$\frac{2R_2}{R_{13}} = \frac{2R_2}{R_{16}},$$

the the output signal $S_3$ with no distortion can be also provided regardless of the amplification degree $A_1$ of the push-pull amplifier 10.

Figure 3:
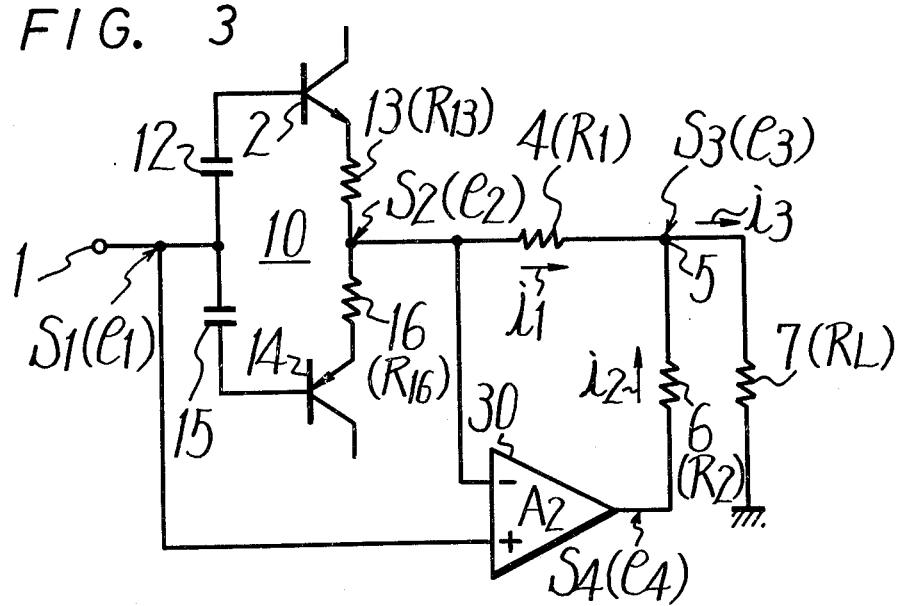

According to the circuit of FIG. 6, since the emitter resistors 13 and 16 serve as the adding resistor 4 as described above, it is needless to especially provide the adding resistor 4 as in the examples of FIG. 3. Further, in this case, it is sufficient that the resistance values of the emitter resistors 13 and 16 are selected optimum for the push-pull amplifier 10 and the amplification degree $A_2$ of the differential amplifier 30 is selected suitably in response to the resistance value of the adding resistor 6.

Further, the resistance values of the first and second resistors 17 and 18 are both selected as large as possible in consideration of the input impedance of the differential amplifier 30 as set forth above, so that the influence by the first and second resistors 17 and 18 can be neglected.

Figure 7:
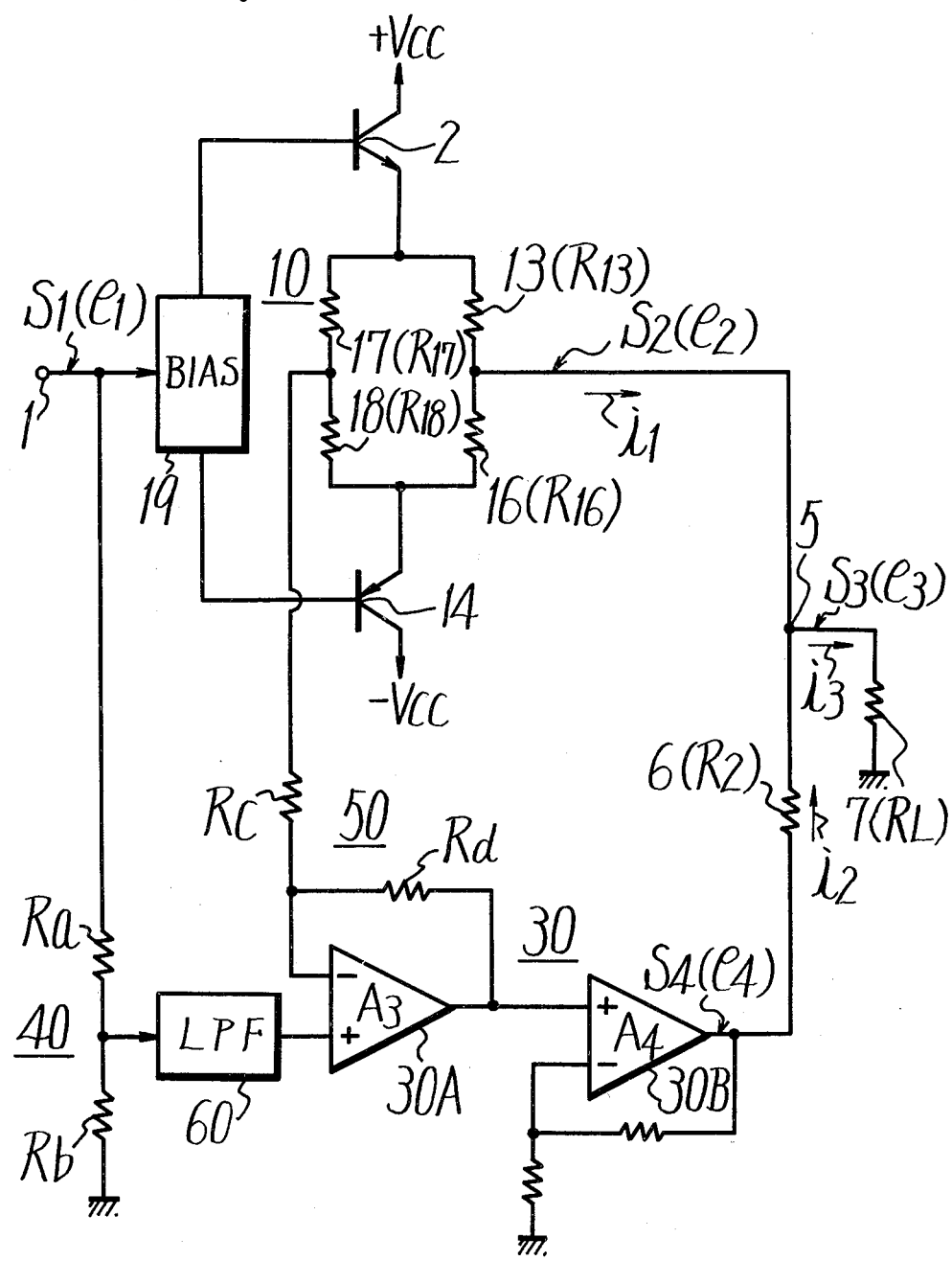

FIG. 7, shows a still further example of the invention which is an improvement of the example shown in FIG. 6. In this example, in order to prevent the differential amplifier 30 from being driven by the amplifier 10, the input signal component is contained in the output signal from the differential amplifier 30 similar to the example of FIG. 5. That is, the amplifier 10 is formed as a push-pull amplifier consisting of transistors 2 and 14. A series connection of emitter resistors 13 and 16 is connected between the emitters of transistors 2 and 14, and a series connection of detecting resistors 17 and 18 is connected in parallel to the serially connected emitter resistors 13 and 16. The connection point between the resistors 13 and 16 is connected directly to the point 5, and the signal appeared at the connection point between the resistors 17 and 18 is supplied to the differential amplifier 30. The bias circuit 19 is provided between the input terminal 1 and the bases of the transistors 2, 14. The other circuit construction of FIG. 9 is substantially same as that of FIG. 5.

With the circuit of FIG. 7, the emitter resistors 13 and 16 serve also as the adding resistor 4 used in the example of, for example, FIG. 3 and are selected to have the resistance values of $R_{13}=2R_1$ and $R_{16}=R_{13}$, when the push-pull amplifier 10 operates in class-A.

The above is same when the push-pull amplifier 10 operates in class-B.

The above description is given on a single preferred embodiment of the invention, but it will be apparent that many modifications and variations could be effected by one skilled in the art without departing from the spirits or scope of the novel concepts of the invention, so that the scope of the invention should be determined by the appended claims only.

We claim as our invention:

1. A distortion eliminating circuit for use with an amplifier, comprising:
   (a) an amplifier for amplifying an input signal;
   (b) difference detecting means for detecting a difference between two signals;
   (c) first transmitting means for transmitting the input signal to said difference detecting means;
   (d) second transmitting means for transmitting an output signal from said amplifier to said difference detecting means;
   (e) adding resistor means for adding the outputs from said amplifier and difference detecting means to each other and supplying an added signal to a load; and
   (f) first adjusting means for adjusting at least one of said first and second transmitting means and said adding resistor means such that a distortion component contained in the output signal from said difference detecting means is made substantially opposite in phase and substantially the same in level as a distortion component contained in the output signal from said amplifier at the output side of said adding resistor means;
   (g) second adjusting means for adjusting at least one of said first and second transmitting means and said adding resistor means such that input signal components contained in the output from said difference detecting means become substantially same as the output signal from said amplifier in phase and level.

2. A distortion eliminating circuit for use with an amplifier, comprising:
   (a) a push-pull amplifier consisting of two transistors which are different in conductivity type and connected in series through a first series connection of resistors thereof, a connection point therebetween being connected to a load;
   (b) difference detecting means for detecting a difference between two signals;
   (c) a second series connection of resistors connected in parallel to said first series connection of resistors;
   (d) first transmitting means for transmitting an input signal applied to said push-pull amplifier to said difference detecting means;
   (e) second transmitting means for transmitting a signal appearing at a connection point between the resistors of said second series connection to said difference detecting means; and
   (f) adding means for adding outputs from said push-pull amplifier and difference detecting means to each other and supplying an added output to a load.

3. A distortion eliminating circuit as claimed in claim 1 or 2, in which said difference detecting means is a differential amplifier.

4. A distortion eliminating circuit as claimed in claim 1 or 2, in which said first transmitting means includes a low pass filter.

5. A distortion eliminating circuit as claimed in claim 1, in which said amplifier is a push-pull amplifier of an emitter follower configulation.

6. A distortion eliminating circuit as claimed in claim 1 or 2, in which said adjusting means is a resistor divider.

7. A distortion eliminating circuit as claimed in claim 3, in which said differential amplifier consists of first and second differential amplifiers connected in cascade.

* * * * *